(12) United States Patent
Kim et al.

(10) Patent No.: US 9,337,246 B2
(45) Date of Patent: *May 10, 2016

(54) ORGANIC LIGHT EMITTING DISPLAY DEVICE AND METHOD OF MANUFACTURING THE SAME USING A SOLUTION PROCESS

(71) Applicant: SAMSUNG DISPLAY CO., LTD., Yongin, Gyeonggi-do (KR)

(72) Inventors: Young Il Kim, Hwaseong-si (KR); Euigyu Kim, Suwon-si (KR); Arong Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/307,278

(22) Filed: Jun. 17, 2014

(65) Prior Publication Data

US 2014/0361278 A1    Dec. 11, 2014

Related U.S. Application Data

(63) Continuation of application No. 13/907,695, filed on May 31, 2013, now Pat. No. 8,786,174.

(30) Foreign Application Priority Data

Oct. 8, 2012    (KR) .......................... 10-2012-0111352

(51) Int. Cl.
*H01L 27/32*    (2006.01)
*H01L 51/50*    (2006.01)
(Continued)

(52) U.S. Cl.
CPC ........ *H01L 27/3246* (2013.01); *H01L 27/3244* (2013.01); *H01L 51/0003* (2013.01); *H01L 51/0007* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5203* (2013.01); *H01L 51/56* (2013.01);
(Continued)

(58) Field of Classification Search
None
See application file for complete search history.

(56) References Cited

U.S. PATENT DOCUMENTS

| 8,492,754 | B2 | 7/2013 | Nishiyama et al. |
| 8,786,174 | B2 * | 7/2014 | Kim .................... H01L 51/0003 257/88 |
| 9,105,860 | B2 * | 8/2015 | Hwang ............... H01L 51/0058 |
| 2009/0174320 | A1 * | 7/2009 | Kim .................... H01L 27/3246 313/504 |
| 2011/0272715 | A1 | 11/2011 | Kang et al. |

(Continued)

FOREIGN PATENT DOCUMENTS

| KR | 10-2005-0067647 | 7/2005 |
| KR | 10-2005-0110793 | 11/2005 |
| KR | 10-2009-0046100 | 5/2009 |

*Primary Examiner* — Minh-Loan Tran
(74) *Attorney, Agent, or Firm* — Lewis Roca Rothgerber Christie LLP (57) ABSTRACT

An organic light emitting display device includes a substrate in which a first pixel area and a second pixel area different from each other are defined, a first electrode, a pixel defining layer, a common layer, a first surface processing layer, a second surface processing layer, a first liquid solution layer, a second liquid solution layer, and a second electrode. The first surface processing layer has a first width and is correspondingly included in the first pixel area. The second surface processing layer has a second width different from the first width and is correspondingly included in the second pixel area. The first liquid solution layer has the first width, and the second liquid solution layer has the second width. The first and second liquid solution layers have the same volume and different thicknesses.

19 Claims, 4 Drawing Sheets

(51) Int. Cl.
*H01L 51/52* (2006.01)
*H01L 51/00* (2006.01)
*H01L 51/56* (2006.01)

(52) U.S. Cl.
CPC ........ *H01L 27/3211* (2013.01); *H01L 27/3283* (2013.01); *H01L 2251/558* (2013.01)

(56) References Cited

U.S. PATENT DOCUMENTS

2013/0187163 A1* 7/2013 Kim .................... H01L 51/5271 257/59
2015/0102305 A1* 4/2015 Jung .................... H01L 27/3211 257/40

* cited by examiner

ORGANIC LIGHT EMITTING DISPLAY DEVICE AND METHOD OF MANUFACTURING THE SAME USING A SOLUTION PROCESS

CROSS REFERENCE TO RELATED APPLICATIONS

This application is a continuation of U.S. patent application Ser. No. 13/907,695, filed on May 31, 2013, entitled "ORGANIC LIGHT EMITTING DISPLAY DEVICE AND METHOD OF MANUFACTURING THE SAME," which claims priority to and the benefit of Korean Patent Application No 10-2012-0111352, filed on Oct. 8, 2012, the entire contents of both of which are hereby incorporated by reference.

BACKGROUND

The following description relates to organic light emitting display devices and methods of manufacturing the same, and more particularly, to an organic light emitting display device using a solution process and a method of manufacturing the same.

Since an organic light emitting display device has a self-light emitting characteristic and does not need a separate light source, it can be miniaturized and be light in weight. Also, since an organic light emitting display device has characteristics of low power consumption, high brightness and high reaction velocity, it has been gaining attention as a next generation display device.

An organic light emitting display device includes an anode electrode, an organic light emitting layer and a cathode electrode. In the organic light emitting display device, a hole from the anode electrode and an electron from the cathode electrode are combined with each other in the organic light emitting layer to form an exciton and light is, emitted by an energy generated when the exciton drops from an excited state to a ground state.

The organic light emitting layer may be formed by red, green and blue organic light emitting layers. Because the red, green and blue organic light emitting layers have different light emitting efficiencies from one another, light emitting efficiencies of the red, green and blue organic light emitting layers can be controlled to be the same by forming thicknesses of the red, green and blue organic light emitting layers to be different from one another or by forming protection layers, which correspond to the red, green and blue organic light emitting layers respectively with different thicknesses.

The organic light emitting layer or a common layer may be formed using a solution process. To form a desired thickness of the organic light emitting layer or the common layer differently, there is a problem that a size of the nozzle through which a solution is sprayed has to be changed or a process condition has to be changed.

SUMMARY

An aspect of an embodiment of the present invention is directed toward an organic light emitting display device.

In one embodiment, the organic light emitting display device includes a substrate in which, a first pixel area and a second pixel area different from each other are defined; a first electrode disposed on the substrate and included in each of the first and second pixel areas; a pixel defining layer which is disposed on the substrate and the first electrode and includes an opening exposing a part of the first electrode; a common layer formed on an entire surface of the substrate; a surface processing layer which is formed on the substrate and covers the opening and a part of the pixel defining layer connected to the opening; a first liquid solution layer disposed on the surface processing layer and included in the first pixel area; a second liquid solution layer disposed on the surface processing layer and included in the second pixel area; and a second electrode formed on the common layer, the first liquid solution layer and the second liquid solution layer. The first liquid solution layer and the second liquid solution layer have the same volume and different thicknesses.

An aspect of an embodiment of the present invention is directed toward a method of manufacturing an organic light emitting display device.

In one embodiment, the method includes providing a substrate in which a first pixel area and a second pixel area different from each other are defined; forming a first electrode at each of the first pixel area and the second pixel area on the substrate; forming a pixel defining layer on the substrate to expose a part of the first electrode; forming a common layer on an entire surface of the substrate; forming a surface processing layer at each of the first pixel area and the second pixel area on the substrate; forming a first liquid solution layer having a first thickness by spraying a first solution having a first volume to the first pixel area; and forming a second liquid solution layer having a second thickness different from the first thickness by spraying a second solution having a first volume to the second pixel area.

BRIEF DESCRIPTION OF THE FIGURES

Embodiments of the present invention (inventive concept) will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF THE EMBODIMENTS

Embodiments of inventive concepts will be described more fully hereinafter with reference to the accompanying drawings, in which embodiments of the present invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

Figure 1:
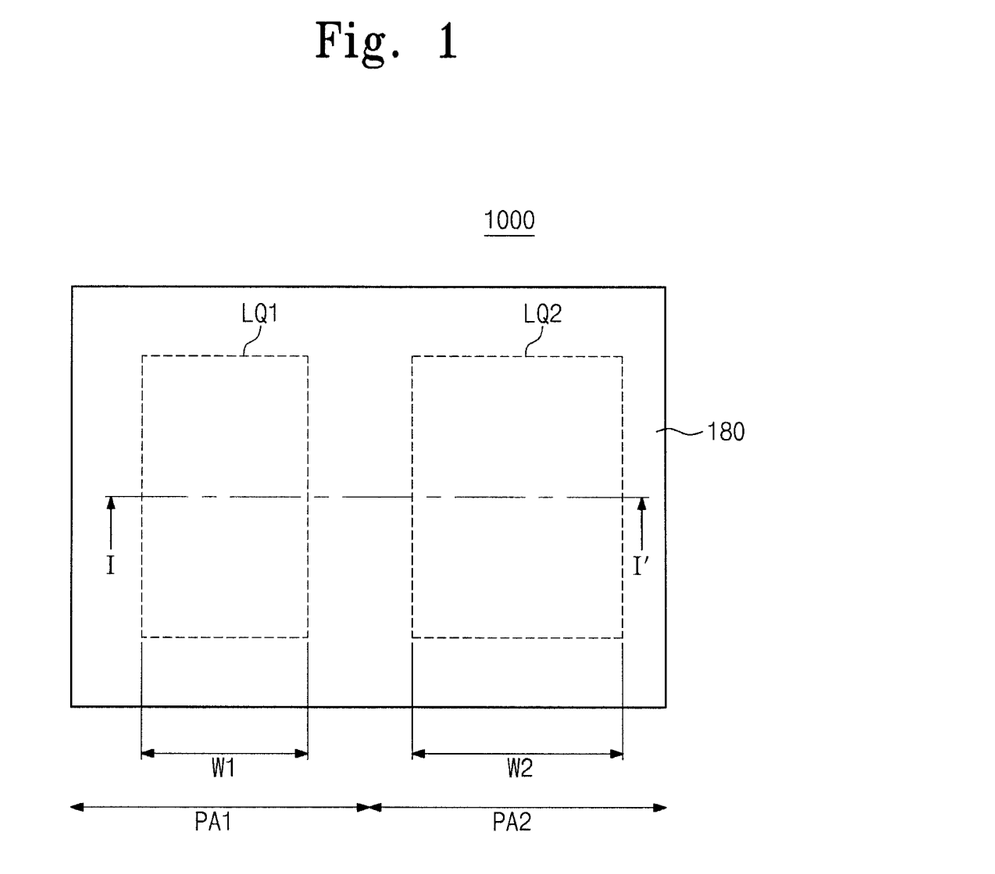
FIG. 1 is a top plan view of an organic light emitting display device in accordance with some embodiments of the inventive concept.
Figure 2:
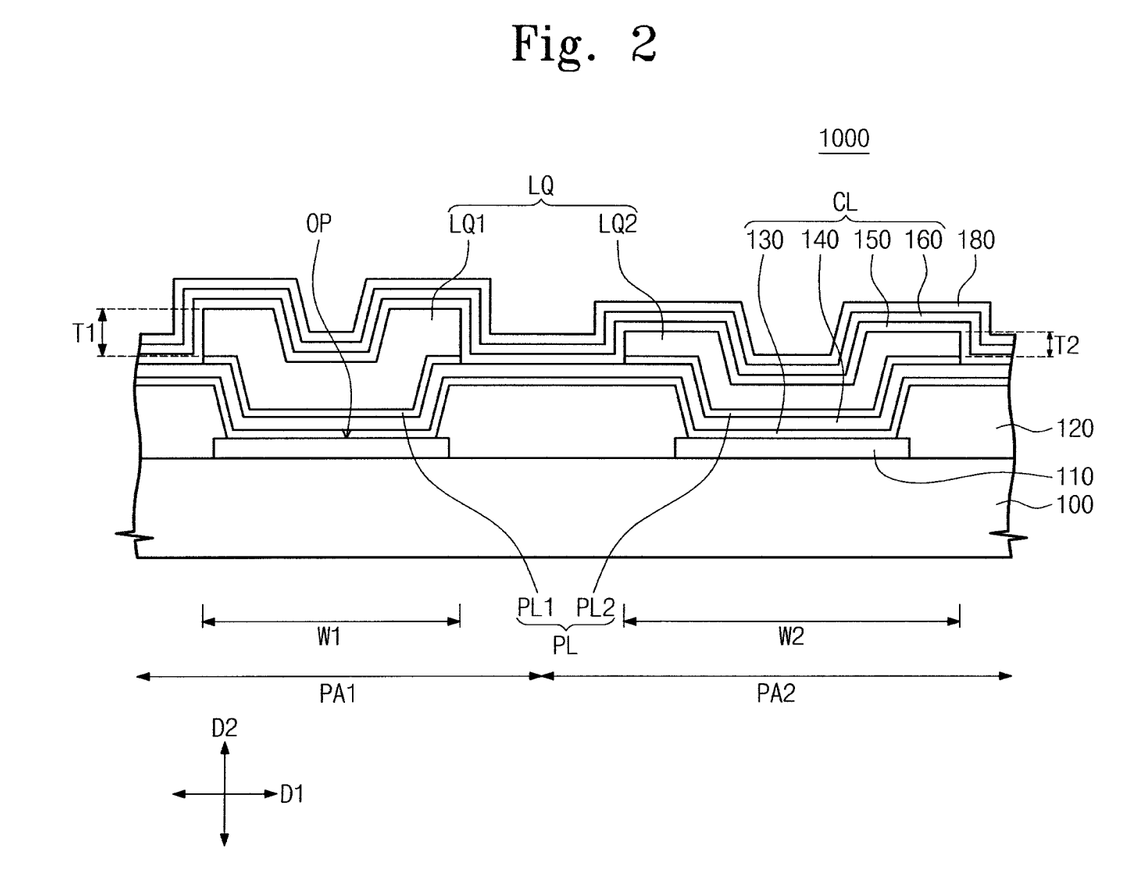
FIG. 2 is a cross sectional view taken along the line I-I' of FIG. 1.

FIG. 1 is a top plan view of an organic light emitting display device in accordance with some embodiments of the inventive concept. FIG. 2 is a cross sectional view taken along the line of FIG. 1.

Referring to FIGS. 1 and 2, the organic light emitting display device 1000 may include a substrate 100, a first electrode 110, a pixel defining layer 120, a common layer CL, a surface processing layer PL, a liquid solution layer LQ, and a second electrode 180. The common layer CL may include a hole injection layer 130, a hole transport layer 140, an electron transport layer 150 and an electron injection layer 160.

A first pixel area PA1 and a second pixel area PA2, which are different from each other, may be defined on the substrate 100. Lights output from the first and second pixel areas PA1 and PA2 may be visible lights having different colors from each other.

The substrate 100 may be a transparent glass or a transparent plastic.

Although not illustrated in the drawings, the organic light emitting display device 1000 may further include a thin film transistor formed in each of the first and second pixel areas PA1 and PA2 on the substrate 100. An output stage of the thin film transistor is connected to the first electrode 110 to apply a data voltage provided from an input stage of the thin film transistor to the first electrode 110.

The first electrode 110 is disposed on the substrate 100 and may be included in each of the first and second pixel areas PA1 and PA2.

The first electrode 110 may be a positive pole (polarity) electrode, which is a hole injection electrode. The first electrode 110 may be formed of a material having a relatively high work function such as indium fin oxide (ITO), indium zinc oxide (IZO), fin oxide ($SnO_2$), zinc oxide (ZnO), etc., and may include a conductive metal such as aluminum (Al), magnesium (Mg), gold (Au), etc., as the need arises.

The pixel defining layer 120 is disposed on the substrate 100 and the first electrode 110 and may include an opening OP exposing a part of the first electrode 110. The pixel defining layer 120 may be formed to cover an edge of the first electrode 110 when viewed from a top plan view.

The pixel defining layer 120 is formed from an insulating material and performs a function of separating the first pixel area PA1 and the second pixel area PA2 from each other.

The common layer CL is a layer which the first and second pixel areas PA1 and PA2 share. Thus, the common layer CL may be formed on an entire surface of the substrate 100.

The hole injection layer 130 performs a function of making a hole easily be released from the first electrode 110. The hole injection layer 130 may be formed on an entire surface of the first electrode 110 and on an entire surface of the pixel defining layer 120. The hole injection layer 130 may have the same thickness on the first pixel area PA1 and the second pixel area PA2.

The hole transport layer 140 performs a function of transporting a hole provided from the hole injection layer 130 to the liquid solution LQ. The hole transport layer 140 may be formed on an entire surface of the hole injection layer 130. The hole transport layer 140 may have the same thickness on the first pixel area PA1 and the second pixel area PA2.

The surface processing layer PL is disposed to cover the opening OP and a part of the pixel defining layer 120 connected to the opening OP when viewed from a top plan view. In FIG. 2, as an illustration, it is illustrated that the surface processing layer PL is disposed on the hole transport layer 140.

The surface processing layer PL may include a first surface processing layer PL1 and a second surface processing layer PL2. The first surface processing layer PL1 is formed on the first pixel area PA1 to have a first width W1 in a first direction D1. The second surface processing layer PL2 is formed on the second pixel area PA2 to have a second width W2 in the first direction D1. In FIG. 2, as an illustration, it is illustrated that the first width W1 is smaller than the second width W2.

The first surface processing layer PL1 and the second surface processing layer PL2 may have the same thickness.

The first surface processing layer PL1 and the second surface processing layer PL2 may be formed of lyotropic material with respect to a first liquid solution LQ1 and a second liquid solution layer LQ2 respectively. That is, the first surface processing layer PL1 and the second surface processing layer PL2 may be formed of lyotropic material having a high affinity with a solution for forming the liquid solution layer L. For example, if the solution is a hydrophilic solution, the first surface processing layer PL1 and the second surface processing layer PL2 may be formed of hydrophilic material.

The first surface processing layer PL1 and the second surface processing layer PL2 may be formed by using a plasma processing or coating a lyotropic material.

The liquid solution layer LQ may be formed through a liquid solution process. The liquid solution layer LQ may be formed by preparing a solution in which various solutes are dissolved in a solvent having volatility, and then spraying and drying the solution.

The liquid solution layer LQ may be an organic light emitting layer that actually emits a light. Thus, the solution may include an organic light emitting material.

The liquid solution layer LQ may include the first liquid solution layer LQ1 and the second liquid solution layer LQ2.

The first liquid solution layer LQ1 is correspondingly disposed on the first surface processing layer PL1 and may have the first width W1 in the first direction D1. The second liquid solution layer LQ2 is correspondingly disposed on the second surface processing layer PL2 and may have the second width W2 in the first direction D1. The first width W1 is different from the second width W2.

Also, the first liquid solution layer LQ1 may have a first thickness T1 in a second direction D2, and the second liquid solution layer LQ2 may have a second thickness T4 in the second direction D2.

A volume of the first liquid solution layer LQ1 and a volume of the second liquid solution layer LQ2 may be the same. Solutions for forming the first and second liquid solution layers LQ1 and LQ2 are equally sprayed on the first surface processing layer PL1 and the second surface processing layer PL2 respectively. The sprayed solutions exist only on the first and second surface processing layers PL1 and PL2 which are lyotropic materials and do not exist on the area on which the first and second surface processing layers PL1 and PL2 are not formed. Since the first width W1 and the second width W2 are different from each other, a solid solute (an organic light emitting material) which remains after volatilizing the sprayed solutions has different thicknesses on the first pixel area PA1 and the second pixel area PA2 respectively.

To precisely control a location at which the liquid solution layer LQ is formed, the organic light emitting display device 1000 may form the hole transport layer 140 using a liquid-repellent material or may further include a liquid-repellent material formed between the first and second surface processing layers PL1 and PL2.

The electron transport layer 150 performs a function of transporting an electron provided from the electron injection layer 160 to the liquid solution layer LQ. The electron transport layer 150 may be formed on an entire surface of the substrate 100 on which the liquid solution layer LQ is formed. The electron transport layer 150 may have the same thickness on the first pixel area PA1 and the second pixel area PA2.

The electron injection layer 160 performs a function of making an electron easily be released from the second electrode 180. The electron injection layer 160 may be formed on an entire surface of the electron transport layer 150. The electron injection layer 160 may have the same thickness on the first pixel area PA1 and the second pixel area PA2.

The second electrode 180 may be disposed on an entire surface of the electron injection layer 160.

The second electrode 180 may be a negative pole (polarity) electrode which is an electron injection electrode. The second electrode 180 may be formed of metal, alloy and electro conductive compounds that have a relatively low work function, and combinations thereof. The second electrode 180 may be formed of lithium (Li), magnesium (Mg), aluminum (Al), aluminum-lithium (Al—Li), magnesium-indium (Mg—In), magnesium-silver (Mg—Ag), indium tin oxide (ITO), indium zinc oxide (IZO), tin oxide ($SnO_2$), zinc oxide (ZnO), etc.

According to the organic light emitting display device 1000 in accordance with some embodiments of the inventive concept, by forming the surface processing layers having different widths on the first pixel area PA1 and the second pixel area PA2 respectively, even if using the same amount of solutions, liquid solution layers having different thicknesses can be formed on the first pixel area PA1 and the second pixel area PA2 respectively. Thus, without changing a processing condition or a size of the nozzle for spraying a solution, liquid solution layers having different thicknesses can be formed and thereby a resonance condition according to a color of light, being emitted at each pixel area can be realized.

The organic light emitting display device 1000 in accordance with some embodiments of the inventive concept has two pixel areas but it is not limited thereto. The organic light emitting display device 1000 may have three or more pixel areas. As an illustration, in the case that three different pixel areas from one another are defined on the substrate 100, thicknesses of liquid solution layers formed at the three pixel areas are different from one another but their volumes may be the same. In one embodiment, lights emitted from the three pixel areas may be a red visible light, a green visible light and a blue visible light respectively.

Figure 3:
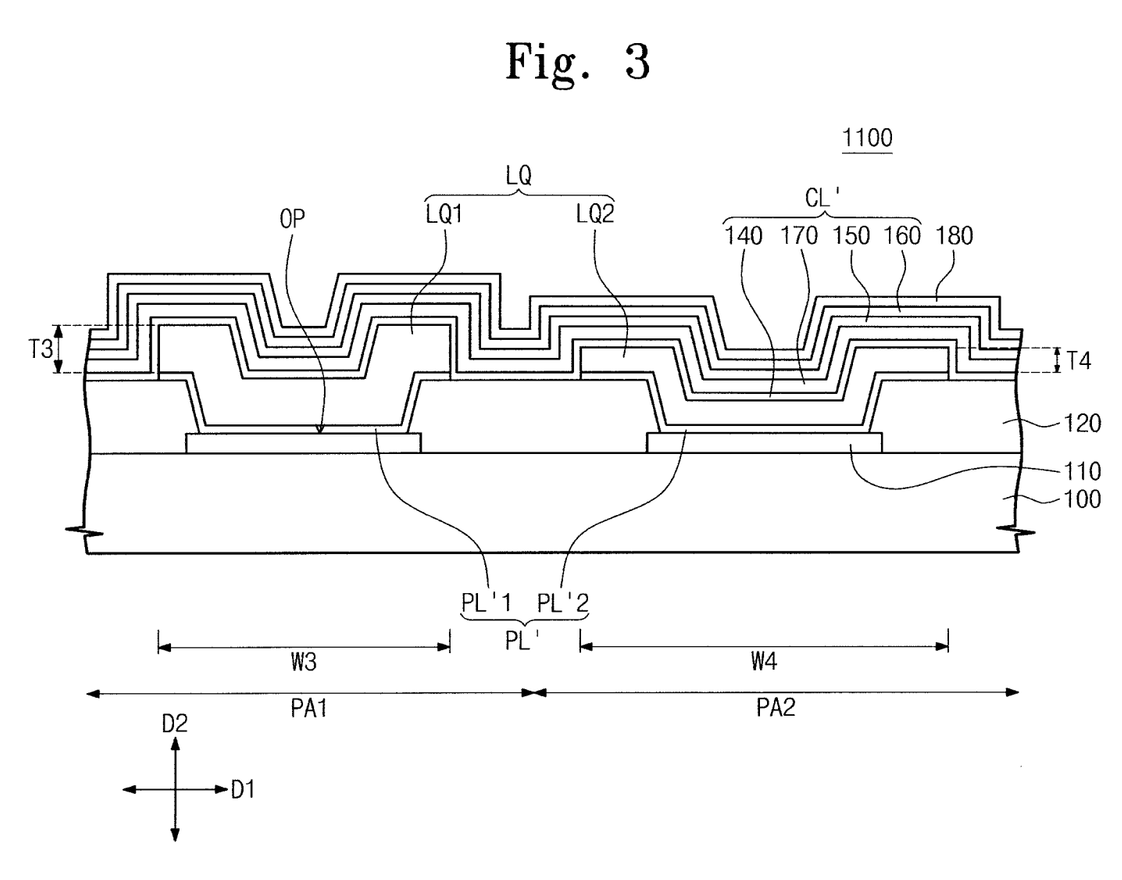
FIG. 3 is a cross sectional view illustrating an organic light emitting display device in accordance with some other embodiments of the inventive concept.

FIG. 3 is a cross sectional view illustrating an organic light emitting display device 1100 in accordance with some other embodiments of the inventive concept. As compared with the organic light emitting display device 1000 in accordance with some embodiments, in the organic light emitting display device 1100 in accordance with some other embodiments, locations of the surface processing layer and liquid solution layer are different and functions of the liquid solution layer and the common layer are different.

Referring to FIG. 3, the organic light emitting display device 1100 may include a substrate 100, a first electrode 110, a pixel defining layer 120, a common layer CL', a surface processing layer PL', a liquid solution layer LQ', and a second electrode 180. The common layer CL' may include a hole transport layer 140, an organic light emitting layer 170, an electron transport layer 150, and an electron injection layer 160.

The pixel defining layer 120 is disposed on the substrate 100 end may include an opening OP exposing a part of the first electrode 110.

The surface processing layer PL' is disposed to cover the opening OP and a part of the pixel defining layer 120 connected to the opening OP when viewed from a top plan view.

In FIG. 3, it is illustrated as an illustration that the surface processing layer PL' is disposed on the pixel defining layer 120.

The surface processing layer PL' includes a first surface processing layer PL'1 and a second surface processing layer PL'2. The first surface processing layer PL'1 is formed at the first pixel area PA1 and may have a first width W3 in a first direction D1. The second surface processing layer PL'2 is formed at the second pixel area PA2 and may have a second width W4 in a first direction D1. In FIG. 3, the first width W3 is smaller than the second width W4.

The liquid solution layer LQ' is a hole injection and may be formed using a solution process.

The liquid solution layer LQ' may include a first liquid solution layer LQ'1 and a second liquid solution layer LQ'2. The first liquid solution layer LQ'1 is correspondingly disposed on the first surface processing layer PL'1 and may have the first width W3 in the first direction D1. Also, the first liquid solution layer LQ'1 may have a first thickness T3 in a second direction D2.

The second liquid solution layer LQ'2 is correspondingly disposed on the second surface processing layer PL'2 and may have the second width W4 in the first direction D1. Also, the second liquid solution layer LQ'2 may have a second thickness T4 in the second direction D2.

According to the organic light emitting display device 1100, the hole injection layer is formed through a solution process and the hole injection layers having different thicknesses may be formed on the first pixel area PA1 and the second pixel area PA2 respectively. Thus, the organic light emitting display device 1100 can obtain the same effect as the organic light emitting display device 1000.

In organic light emitting display device 1100, the hole injection layer is described to be the liquid solution layer but it is not limited, thereto. The liquid solution layer may be at least one of the hole transport layer, the electron transport layer and the electron injection layer. In the case that the electron transport layer is the liquid solution layer, the surface processing layer is disposed on the organic light emitting layer, and the liquid solution layer is disposed between the surface processing layer and the electron injection layer.

In the case that the liquid solution layer is constituted by two or more layers, the surface processing layer may also be constituted by two or more layers.

Figure 4:
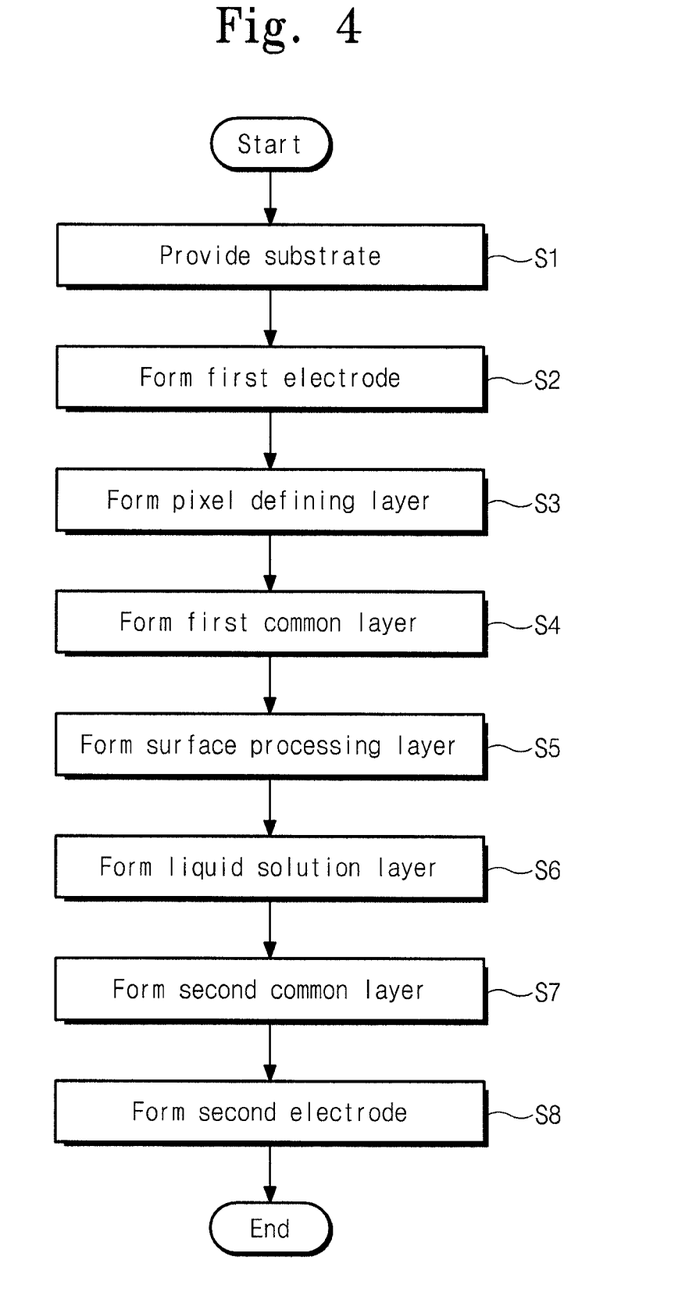
FIG. 4 is a flow chart, illustrating a method of manufacturing an organic light emitting display device in accordance with some embodiments of the inventive concept.

FIG. 4 is a flow chart illustrating a method of manufacturing an organic light emitting display device in accordance with some embodiments of the inventive concept.

Referring to FIGS. 1, 2 and 4, a subs rate 100 (in which a first pixel area PA1 and a second pixel area PA2 different from the first pixel area PA1 are defined) is prepared (S1). In (S1) and according to one embodiment, the substrate 100 is in a state of before a first electrode 110 is formed. The substrate 100 may include a thin film transistor and a planarization layer, which is disposed on the thin film transistor and includes a contact hole exposing an output stage of the thin film transistor.

After that, the first electrode 110 is formed at the first pixel area PA1 and the second pixel area PA2 (S2) on the substrate 100. The first electrode 110 may be formed by depositing a conductive layer on an entire surface of the substrate 100, and then patterning the conductive layer.

A pixel defining layer 120 is formed en the substrate 100 on which the first electrode 110 is formed (S3). The pixel defining layer 120 may be formed by depositing an insulating material on an entire surface of the substrate 100, and then patterning the insulating material. The pixel defining layer 120 is patterned to expose a part of the first electrode 110.

After that, a first common layer is formed on an entire surface of the pixel defining layer 120 (S4). The first common layer may include a hole injection layer 130 and a hole transport layer 140.

After that, a surface processing layer PL is, formed on the first common layer (S5). The surface processing layer PL may be formed by forming a lyotropic material layer on the first common layer to have a uniform thickness, and then patterning the lyotropic material layer. At this time the lyotropic material layer is patterned to have different first direction widths at the first pixel area PA1 and the second pixel area PA2 respectively and thereby a first surface processing layer PL1 and a second surface processing layer PL2 are formed.

After that, a liquid solution layer LQ is formed on the surface processing layer PL (S6). The liquid solution layer LQ may be formed using a solution process. The solution process may be one of a spin coating, an inkjet printing, a gravure printing, a roll to roll processing, a syringe injection, a dip coating, a spray coating, a relief printing, a lithography printing, a flexography printing and a screen printing.

A solution used in the solution process is equally sprayed on the first pixel area PA1 and the second pixel area PA2. A solution sprayed on the first pixel area PA1 may be defined as a first solution, and a solution sprayed on the second pixel area PA2 may be defined as a second solution.

The first and second solutions may be sprayed using a nozzle of the me size.

A first direction width of each of the first and second solutions is controlled by a first direction width of each of the first and second surface processing layers PL1 and PL2 which are the lyotropic material.

After that, when drying the first solution and the second solution, a solvent is evaporated and only solid solute remains. As a result, a first liquid solution layer LQ1 and a second liquid solution layer LQ2 are formed. The first and second liquid solution layers LQ1 and LQ2 have the same volume but have different second direction thicknesses due to a difference of the first direction widths.

After that, a second common layer is formed on an entire surface of the liquid solution layer LQ (S7). The second common layer may include an electron transport layer 150 and an electron injection layer 160.

Finally, a second electrode 180 is formed on an entire surface of the second common layer (S8).

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. An organic light emitting display device comprising:
a substrate in which a first pixel area and a second pixel area different from each other are defined;
a first electrode on the substrate and included in each of the first and second pixel areas;
a pixel defining layer having an opening exposing a part of the first electrode;
a first liquid solution layer included in the first pixel area;
a second liquid solution layer included in the second pixel area; and
a second electrode on the first liquid solution layer and the second liquid solution layer,
wherein the first liquid solution layer and the second liquid solution layer have the same volume and different thicknesses, wherein the organic light emitting display further comprises:
a common layer disposed on the substrate; and
a surface processing layer on the substrate and covering the opening and a part of the pixel defining layer connected to the opening.

2. The organic light emitting display device of claim 1, wherein the surface processing layer comprises:
a first surface processing layer which has a first width and is correspondingly included in the first pixel area; and
a second surface processing layer which has a second width different from the first width and is correspondingly included in the second pixel area.

3. The organic light emitting display device of claim 2, wherein the first surface processing layer and the second surface processing layer are formed of lyotropic material with respect to the first liquid solution layer and the second liquid solution layer, respectively.

4. The organic light emitting display device of claim 2, wherein the first liquid solution layer and the second liquid solution layer are in contact with a top surface of the first surface processing layer and a top surface of the second surface processing layer, respectively.

5. The organic light emitting display device of claim 4, wherein the first liquid solution layer has a first width and the second liquid solution layer has a second width.

6. The organic light emitting display device of claim 5, wherein each of the first liquid solution layer and the second liquid solution layer is an organic light emitting layer from which a light is emitted.

7. The organic light emitting display device of claim 6, wherein the common layer comprises:
a hole injection layer on the pixel defining layer;
a hole transport layer on the hole injection layer;
an electron transport layer on the hole transport layer; and
an electron injection layer on the electron transport layer.

8. The organic light emitting display device of claim 7, wherein the surface processing layer, the first liquid solution layer and the second liquid solution layer are disposed between the hole transport layer and the electron transport layer.

9. The organic light emitting display device of claim 4, wherein each of the first liquid solution layer and the second liquid solution layer comprises at least one of a hole injection layer on the pixel defining layer; a hole transport layer on the hole injection layer; an organic light emitting layer on the hole transport layer; an electron transport layer on the hole transport layer; and an electron injection layer on the hole transport layer.

10. The organic light emitting display device of claim 9, wherein in the case that each of the first liquid solution layer and the second liquid solution layer comprises one, two, three or four of the hole injection layer, the hole transport layer, the organic light emitting layer, the electron transport layer and the electron injection layer, the common layer comprises the rest.

11. A method of manufacturing an organic light emitting display device, the method comprising:
providing a substrate in which a first pixel area and a second pixel area different from each other are defined;

forming a first electrode at each of the first pixel area and the second pixel area on the substrate;

forming a pixel defining layer on the substrate to expose a part of the first electrode;

forming a first liquid solution layer having a first thickness by spraying a first solution having a first volume to the first pixel area; and forming a second liquid solution layer having a second thickness different from the first thickness by spraying a second solution having the first volume to the second pixel area.

12. The method of claim 11, wherein the forming of the surface processing layer further comprises:

forming a common layer on the substrate; and forming a surface processing layer at each of the first pixel area and the second pixel area on the substrate.

13. The method of claim 12, wherein the forming of the surface processing layer comprises:

forming a lyotropic material layer with respect to the first solution and the second solution on the substrate to have a uniform thickness; and forming a first surface processing layer and a second surface processing layer by patterning the lyotropic material layer to have different widths at the first pixel area and the second pixel area, respectively.

14. The method of claim 13, wherein the forming of the first liquid solution layer comprises:

spraying the first solution to have the same width as the first surface processing layer; and drying the first solution.

15. The method of claim 13, wherein the forming of the second liquid solution layer comprises:

spraying the second solution to have the same width as the second surface processing layer; and drying the second solution.

16. The method of claim 12, wherein the forming of the common layer comprises:

forming a hole injection layer on the pixel defining layer;

forming a hole transport layer on the hole injection layer;

forming an electron transport layer on the hole transport layer; and forming an electron injection layer on the electron transport layer.

17. The method of claim 16, wherein the surface processing layer, the first solution layer and the second solution layer are formed after the hole transport layer is formed and before the electron transport layer is formed.

18. The method of claim 11, wherein the first solution and the second solution are sprayed using a nozzle of the same size.

19. The method of claim 11, further comprising forming a second electrode on the substrate.

* * * * *